United States Patent [19]

Naylor et al.

[11] Patent Number: 4,647,906
[45] Date of Patent: Mar. 3, 1987

[54] LOW COST DIGITAL-TO-ANALOG CONVERTER WITH HIGH PRECISION FEEDBACK RESISTOR AND OUTPUT AMPLIFIER

[75] Inventors: Jimmy R. Naylor; David F. Mietus; Robert L. White, all of Tucson, Ariz.

[73] Assignee: Burr-Brown Corporation, Tucson, Ariz.

[21] Appl. No.: 750,338

[22] Filed: Jun. 28, 1985

[51] Int. Cl.$^4$ .............................. H03K 13/05
[52] U.S. Cl. ...................... 340/347 DA; 340/347 CC
[58] Field of Search ................ 340/347 DA, 347 CC; 338/195; 323/354

[56] References Cited

U.S. PATENT DOCUMENTS

| | | | |
|---|---|---|---|
| 3,890,610 | 6/1975 | Cahen | 340/347 CC |
| 4,150,366 | 4/1979 | Price | 340/347 CC |
| 4,201,970 | 5/1980 | Onyshkevych | 323/354 X |
| 4,335,371 | 6/1982 | Connolly, Jr. et al. | 340/347 CC |
| 4,338,590 | 7/1982 | Connolly, Jr. et al. | 340/347 CC |
| 4,364,006 | 12/1982 | Makabe et al. | 338/195 X |
| 4,381,497 | 4/1983 | Lillis et al. | 340/347 DA |
| 4,467,312 | 8/1984 | Komatsu | 338/195 X |
| 4,523,182 | 6/1985 | Harvey et al. | 340/347 DA |
| 4,529,958 | 7/1985 | Person et al. | 338/195 X |
| 4,542,368 | 9/1985 | Lillis | 340/347 CC |

*Primary Examiner*—William M. Shoop, Jr.
*Assistant Examiner*—Sharon D. Logan
*Attorney, Agent, or Firm*—Cahill, Sutton & Thomas

[57] ABSTRACT

An integrated circuit digital-to-analog converter includes a nichrome feedback resistor having ±1% accuracy in its output amplifier, a plurality of bit current determining resistors that have ±30% manufacturing accuracy, a bias voltage circuit that produces a temperature-compensated bias voltage including an integrated potentiometer that is laser trimmed to compensate for the inaccuracy of the bit current determining resistors. The bit current determining resistors thereby produce constant, precise temperature-independent bit currents. The integrated potentiometer is accurately laser trimmed without changing the series resistance of the potentiometer. This prevents current density changes that change the temperature sensitivity of temperature-compensating elements in the bias voltage circuit.

20 Claims, 5 Drawing Figures

LOW COST DIGITAL-TO-ANALOG CONVERTER WITH HIGH PRECISION FEEDBACK RESISTOR AND OUTPUT AMPLIFIER

BACKGROUND OF THE INVENTION

The invention relates to digital-to-analog converters, and more particularly to digital-to-analog converters that include very precise, externally accessible "output amplifier feedback resistors", and small sized, low cost bit current determining resistors, the sheet resistance of which can have manufacturing tolerances as high as ±30%.

Monolithic digital-to-analog converter (DAC) circuits are well known in the art, and typically include a plurality of bit switches each responsive to a particular bit within the digital input word for selectively steering an associated bit switch current to a current summing node to provide an analog output current. The current contributed to the analog output current by each of the bit switches is scaled in a binarily weighted fashion in accordance with the binary weighting of the particular bit to which that bit switch is responsive. Many such digital-to-analog converter circuits include an output amplifier into which the analog current flows via a current summing conductor. Such output amplifiers often have a feedback resistor. An analog output voltage that is produced by the output amplifier has a value proportional to the ratio of the resistance of a bit current determining resistor and the resistance of the feedback resistor. Consequently, if the feedback resistor has a very precise absolute value, then the current determining resistor ordinarily also must have a precise absolute value.

In certain applications of DACs, the terminals of the feedback resistors are externally accessible. Users often connect external resistances in parallel and/or in series with the feedback resistors to adjust the output voltage range of the DAC. In such instances, it is desirable for the feedback resistors to have an extremely precise value, so that the external range adjusting resistors have a predetermined value. However, if each of the feedback resistors has a precise absolute value, then each of the numerous bit current determining resistors ordinarily also must have a precise value. Precise resistors in an integrated circuit usually require a relatively large amount of chip area, which adds to the cost of the DACs.

Those skilled in the art know that relatively high accuracy, low cost monolithic digital-to-analog converters have been implemented wherein the absolute values of the resistances of feedback resistors and the bit current determining resistors are not precise, but the ratios between such feedback resistors and current determining resistors are precise. Customers relying upon precise absolute values of the feedback resistors have been unable to conveniently use such digital-to-analog converters.

Those skilled in the art will appreciate that any high accuracy digital-to-analog converter must have internal bit currents that are substantially independent of temperature over a specified temperature range for the digital-to-analog converter, and that a great deal of attention must be paid to this aspect of circuit performance as the DAC is designed. Typically, internal voltage reference circuits are provided that compensate for the thermal drift in the base-to-emitter voltages of the transistors that produce the base voltage applied to the current source transistors, which thereby produce the voltages across the bit current determining resistors, and thereby determine the bit currents.

Those skilled in the art know that nichrome resistors can be laser trimmed to produce very precise resistive voltage dividers. However, the use of laser trimmed voltage dividers in voltage reference circuits usually results in changes in current density in transistors that produce the reference voltage. Such changes in current density result in changes in the thermal drift of the emitter-to-base voltages of such transistors, and hence in the reference voltages. Consequently, use of laser trimmed resistive voltage dividers usually is avoided in circuitry in which voltage levels must be precisely compensated for thermal drift.

Those skilled in the art also know that it is highly desirable to avoid use of laser trimmed resistors in integrated circuits if very large percentage changes in resistance must be produced by laser trimming, because if a resistor is to be trimmable over a large range, it must be increased in chip area, obviously increasing the cost of the final product. Increase size of trimmable resistors also increases the amount of time required for laser trimming. Since laser trimming equipment is exceedingly expensive, laser trimming stations in an integrated circuit manufacturing facility tend to be "bottlenecks" in a production process. Obviously, designs that substantially increase the area of an integrated circuit chip and increase the amount of laser trimming are to be avoided if possible.

Previous DACs, mostly of hybrid construction, having precision, externally accessible feedback resistors have been provided, wherein the bit currents were trimmed or adjusted to precise values by means of an operational amplifier control circuit that produces the base reference voltage for the bit current source transistors. The operational amplifier in such circuits is adversely affected by parasitic signals produced by signal transitions in the bit switches because the DFM operational amplifier take a long time to settle from such parasitic signals.

Thus, there is an unmet need for a low cost, highly accurate, thermally stable digital-to-analog converter that provides externally accessible output amplifier feedback resistors having very precise absolute values of resistance, yet avoids the need for providing a large number of resistors that must be trimmed to produce a very large precentage change in resistance, and avoids complications caused by capacitive coupling of parasitic signals from the bit switches to reference voltage circuitry that biases the bit current determining resistors. There is also an unmet need for a practical integrated potentiometer. Some integrated potentiometers that are incrementally adjustable between several different resistances are known, such as the ones disclosed in U.S. Pat. Nos. 4,150,366 and 4,201,970. Such prior integrated potentiometers are not accurately enough trimmable to be very useful.

SUMMARY OF THE INVENTION

Accordingly, it is an object of the invention to provide a low cost digital-to-analog converter having a highly accurate externally accessible output amplifier feedback resistor.

It is another object of the invention to provide a low cost digital-to-analog converter with a highly accurate externally accessible output amplifier feedback resistor, and also having relatively small area bit current determining resistors with large variations in sheet resistance, and also having essentially no thermal drift of its output voltage.

It is another object of the invention to provide a practical integrated circuit potentiometer that can be precisely trimmed to produce a predetermined output voltage on a tap conductor thereof without resulting in a significant change in series resistance of the potentiometer.

Briefly described, and in accordance with one embodiment thereof, the invention provides monolithic digital-to-analog converter including a precise externally accessible output amplifier feedback resistor, a plurality of bit current determining resistors that have relatively large sheet resistance variations, and a temperature compensated reference voltage circuit for producing a temperature compensated base voltage on current source transistors that apply voltages across the bit current determining resistors to produce constant, predetermined, temperature-independent bit currents therein, despite the large variation in the sheet resistance of the bit current determining resistors. In the described embodiment of the invention, a laser trimmable nichrome feedback resistor has a very precise absolute value, produced by a laser trimming operation. The bit current determining resistors are laser trimmed only slightly, so that they all have predetermined values or predetermined ratios to each other. NPN bit current transistors having their emitters connected to the bit current determining resistors also have their bases connected to a temperature-compensated reference voltage circuit that includes a zener diode that produces a voltage on the base of a first NPN emitter follower transistor. A nichrome laser trimmable integrated potentiometer is coupled between the emitter of a first emitter follower transistor and a supply voltage conductor. A tap conductor of the potentiometer is connected to the base of a second emitter follower transistor, the emitter of which is coupled to the bases of the NPN bit current source transistors. The integrated potentiometer includes widened "fine trim" sections near each end thereof, and a narrowed center portion with a plurality of spaced transverse nichrome fingers each extending outwardly from the narrowed center portion and contacting a shorting bar that constitutes a center tap conductor. Gross trimming of the integrated potentiometer is accomplished by using a laser beam to sever all but one of the fingers connected to the center tap conductor. Fine trimming of the integrated potentiometer is accomplished by producing a longitudinal cut in one of the widened "fine trim" sections, to produce a precise predetermined bit current in one of the current source transistors. The total resistance of the potentiometer remains substantially unchanged by the trimming thereof, and the current flowing through the potentiometer also remains relatively unchanged. Consequently, the current density, and hence the thermal drift, in the first emitter follower transistor supplying the current through the potentiometer, and the current density in certain other temperature compensating elements, remain essentially unchanged.

DESCRIPTION OF THE INVENTION

Figure 1:
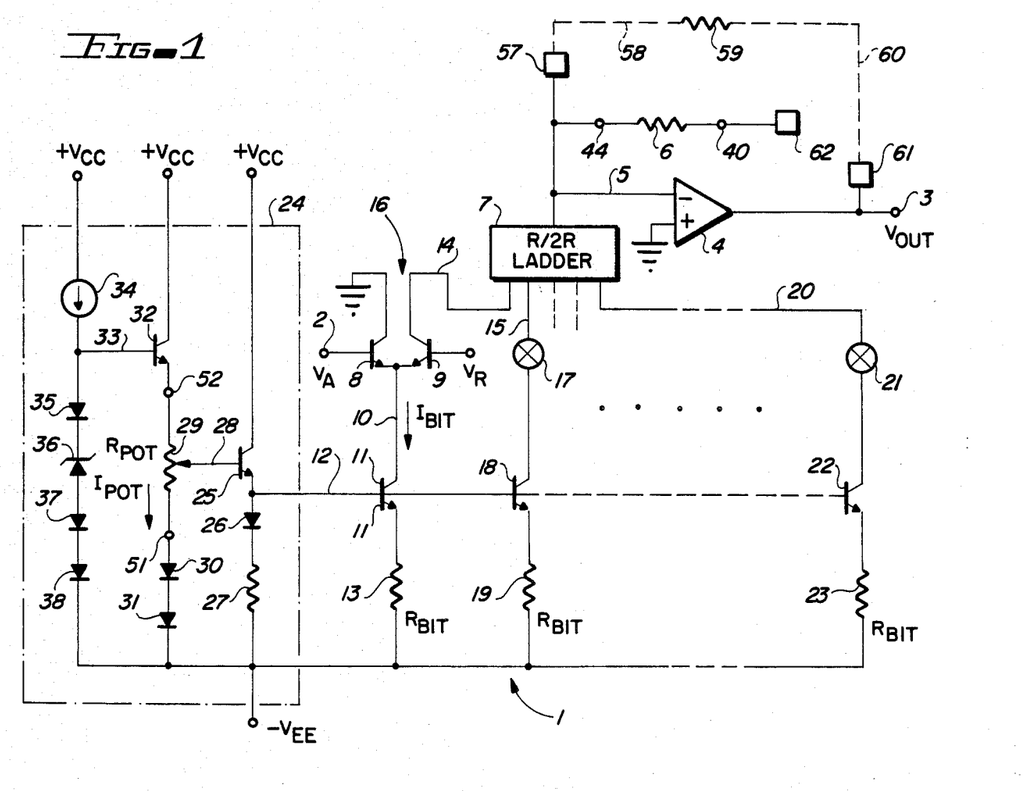
FIG. 1 is a schematic diagram of the invention.

Referring now to FIG. 1, digital-to-analog converter (DAC) 1 includes a plurality of digital inputs such as 2, each having a digital input such as $V_A$ applied thereto. For example, if DAC 1 is a sixteen bit digital-to-analog converter, there will be sixteen digital inputs such as 2. DAC 1 also has an output 3, on which a voltage $V_{OUT}$ is produced. Output terminal 3 is connected to the output of an output amplifier 4. Various suitable output amplifiers can be provided by one skilled in the art. For example, the output amplifier described in co-pending application "LOW VOLTAGE DIGITAL-TO-ANALOG CONVERTER", filed on May 8, 1985, Ser. No. 732,168, commonly assigned and incorporated herein by reference, could be used. The positive input of amplifier 4 is connected to ground, and the negative input thereof is connected to a current summing conductor 5. A feedback resistor is connected between current summing conductor 5 and an external lead 62. Current summing conductor 5 also is connected to an externally accessible pad or lead 57.

Current summing conductor 5 is connected to a conventional R/2R ladder network of the kind widely used by those skilled in the art to provide bit current scaling in analog-to-digital converters.

Each of the digital inputs, such as input 2, is connected to a "bit circuit" such as as 16. Each bit circuit includes a "bit switch" including an NPN transistor 8 having its base connected to or coupled by a level shifting circuit (not shown) to the input terminal 2. Each bit circuit also includes a second NPN transistor 9 having its emitter connected to the emitter of transistor 8 and having its base connected to a suitable temperature-compensated reference voltage $V_R$. The collector of transistor 8 is connected to ground. The collector of transistor 9 is connected by conductor 14 to an input of ladder network 7. The emitters of transistors 8 and 9 are connected by conductor 10 to the collector of a bit current transistor 11. The base of bit current transistor 11 is connected to a temperature-compensated reference voltage conductor 12. The emitter of NPN bit current transistor 11 is connected to one terminal of a bit current determining resistor 13, the other terminal of which is connected to $-V_{EE}$. A bit current $I_{BIT}$ flows through the collector of bit current transistor 11 and is steered either into the ground conductor or into the ladder network 7, depending upon whether $V_A$ is at a high level or a low level.

In the described embodiment of the invention, DAC 1 is a sixteen bit digital-to-analog converter, and includes fifteen other bit switches such as 17 and 21, each essentially idential to bit switch 16 and each coupling an input of the ladder network 7 (such as input 15 or input 20) to the collector of a bit current transistor, such as 18 or 22. The bases of all of the bit current source transistors are connected to reference voltage conductor 12. The emitter of bit current transistor 18 is connected by bit current determining resistor 19 to $-V_{EE}$, and the emitter of bit current transistor 22 is connected by bit current determining resistor 23 to $-V_{EE}$. The resistance of each of the bit current determining resistors is $R_{BIT}$.

Reference numeral 24 generally designates a temperature-compensated voltage reference circuit that produces the reference voltage on conductor 12. Reference voltage circuit 24 includes a constant current source circuit 34 coupled between $+V_{CC}$ and conductor 33. Conductor 33 is connected to the base of an NPN emitter follower transistor 32 and to the anode of a diode 35. The cathode of diode 35 is connected to the cathode of a zener diode 36. The anode of zener diode 36 is connected to the anode of diode 37, the cathode of which is connected to the anode of diode 38. The cathode of diode 38 is connected to $-V_{EE}$. The collector of NPN emitter follower transistor 32 is coupled to $+V_{CC}$, and its emitter is connected by conductor 52 to one terminal of integrated circuit potentiometer 29. The other terminal 51 of integrted potentiometer 29 is connected to the anode of diode 30, the cathode of which is connected to the anode of diode 31. The cathode of diode 31 is connected to $-V_{EE}$.

The tap conductor of potentiometer 29 is connected to conductor 28. Conductor 28 is connected to the base of NPN emitter follower transistor 25, the collector of which is coupled to $+V_{CC}$. The emitter of transistor 25 is connected to conductor 12 and to the anode of diode 26. The cathode of diode 26 is coupled by resistor 27 to $-V_{EE}$.

Figures 2, 3:
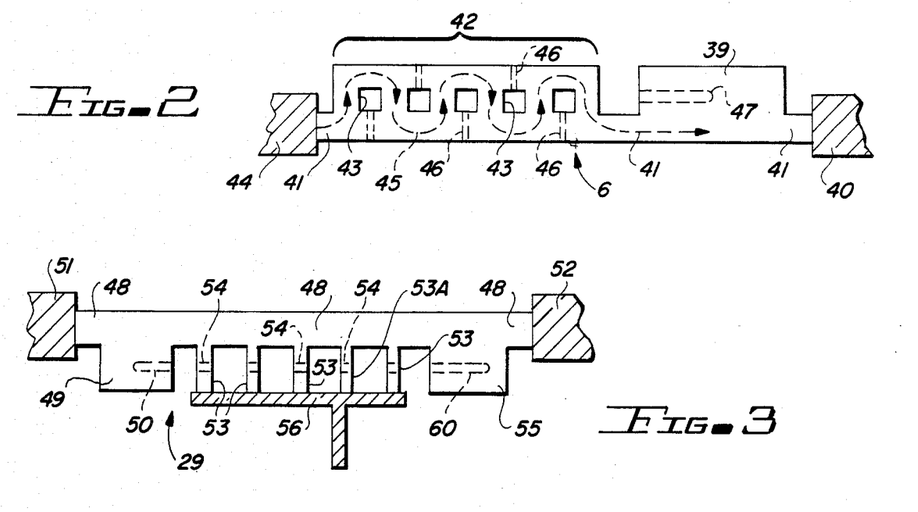
FIG. 2 is a plan view useful in describing a trimmable resistor used in FIG. 1.
FIG. 3 is a plan view of an integrated potentiometer in accordance the invention.

The topography of feedback resistor 6 is shown in FIG. 2. Feedback resistor 6 has a resistance $R_F$, and is composed of a thin layer of nichrome having a sheet resistance of about 210 to 390 ohms per square. Feedback resistor 6 includes relatively narrowed portions 41, a widened "fine trim" section 39, and a relatively widened "gross trim" section 42.

Sections 39, 41, and 42 of feedback resistor all are composed of nichrome. Reference numerals 40 and 44 designate the metal contacts or terminals of feedback resistor 6. Widened gross trim section 42 includes a number of square openings 43. Dotted lines such as 46 designate laser cuts between the outer edges of the gross trim section 42 and the inside boundaries of the openings 43. Dotted line 47 indicates a laser cut that can be made in fine trim section 39.

Before any of the laser cuts 46 or 47 are made, feedback resistor 6 has its minimum value. If all of the laser cuts indicated by the dotted lines 46 are made, gross section 42 has its maximum resistance value, as the current is forced to flow through the path indicated by dotted line 45. It can be easily appreciated that six different "gross" discrete values of resistance can be provided by making various ones of the laser cuts 46. "Fine" trimming then is accomplished by making the laser cut indicated by 47.

The structure of a finely trimmable integrated potentiometer of the present invention is shown in FIG. 3. More specifically, potentiometer 29 includes nichrome narrowed sections 48, a central "gross trim" section including a plurality of spaced, nichrome transverse fingers 53 extending from section 48 to a metal tap conductor 56, and two nichrome widened "fine trim" sections 49 and 55 on either side of the gross trim section. The nichrome of integrated potentiometer 29 is composed of nichrome of the same resistivity of feedback resistor 6 and the bit current determining resistors 13, 19, etc. Metal contacts 51 and 52 are provided on opposite ends of integrated potentiometer 29. Normally, after laser trimming of the nichrome material of which potentiometer 29 is composed, all of the transverse fingers 53 except one will have been completely severed by laser cuts such as 54. Only one of the fingers 53A will remain solid, connecting the narrowed portion 48 to the tap conductor 56. Normally, a laser cut 50 or 60 will be provided in one or the other of the "fine trim" widened sections 49 or 55.

Next, a method will be described for trimming the various resistors in DAC 1 to provide a very stable output voltage and a predetermined precise value of feedback resistor $R_F$. First, it should be appreciated that the bit current determining resistors $R_{BIT}$ are formed of nichrome, the sheet resistance of which normally has a manufacturing tolerance of about ±30% in the assignee's present manufacturing process. However, all of the bit current determining resistors in a particular batch have nearly the same value.

Figure 5:
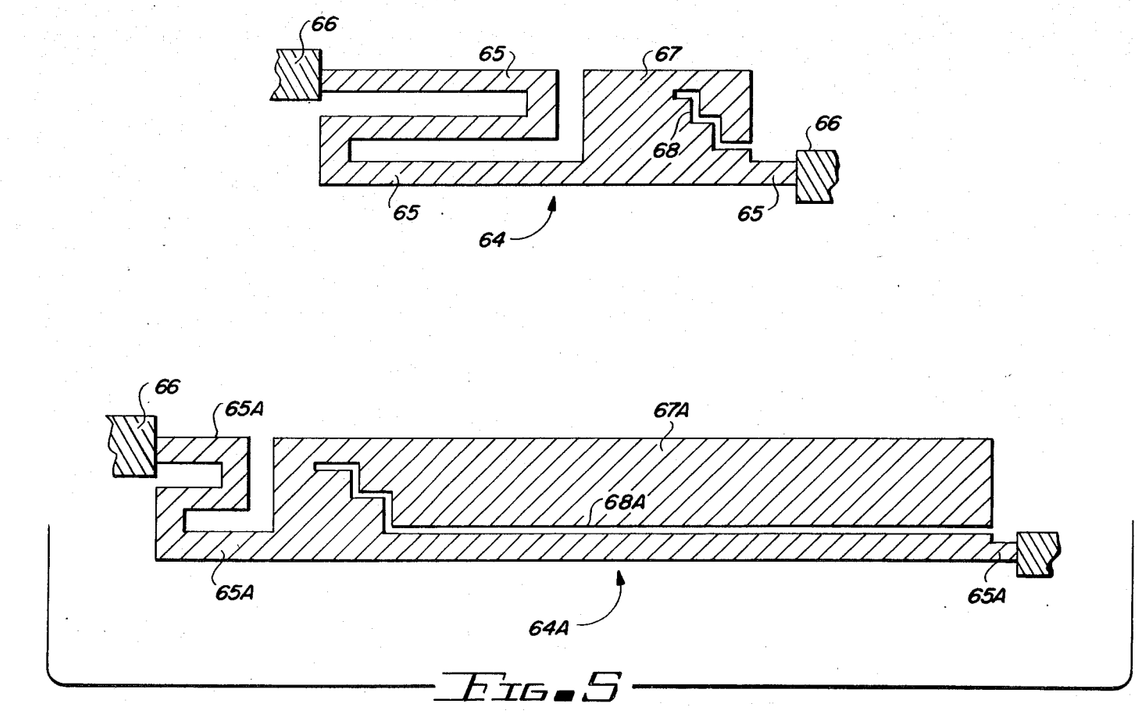
FIG. 5 is a plan view diagram, drawn to scale, of two resistors, and is useful in explaining certain advantages of the circuit of FIG. 1.

Each of the $R_{BIT}$ resistors is laser trimmable, and can have a structure similar to that shown for resistor 64 in FIG. 5, to allow slight trimming. Very short laser cuts such as 68 in FIG. 5 are made to adjust the resistance of each of the bit current determining resistors so that all of the bit currents are essentially identical, or have predetermined binary ratios to each other.

Since the amount of laser trimming required is very slight, these resistors can be designed to occupy a minimum amount of monolithic chip surface area. Furthermore, only a minimum amount of laser trimming time is required. Both of these features lead to substantially reduced chip cost over what the chip cost would be if the bit current determining resistors were designed to be trimmable to absolute values and the nichrome sheet resistance were allowed to vary by the above ±30% amount.

Next, an external precise (less than 0.01%) five kilohm resistor designated by reference numeral 59 is connected between pads 57 and 61, as indicated by dotted lines 58 and 60, by means of suitable wafer probing apparatus and electronic computer controlled test equipment. With suitable values of $+V_{CC}$ and $-V_{EE}$ and ground applied to the leads by the probing apparatus, and with a suitable value of $V_A$ applied to cause a bit current $I_{BIT}$ to flow through bit switch transistor 9 and bit current determining resistor 13 of the most significant bit of DAC 1, a simple computer algorithm measures $V_{OUT}$ and determines which laser cuts 54 should be made in fingers 53 of integrated potentiometer 29 (FIG. 3), and thus which finger 53A connects the tap conductor 56 to the central portion 48 of the integrated potentiometer. The same algorithm also determines which of the "fine trim" sections 49 and 55 needs to be trimmed, and makes an appropriate laser cut 50 or 60 therein to cause $V_{OUT}$ to be equal to exactly five volts. Then the bit current $I_{BIT}$ flowing through current source transistor 11 and bit current determining resistor 13 is exactly one milliampere (plus the base current of transistor 9).

Next, the connection of external resistor 59 is removed, and pad 62 is shorted to pad 61 by the electronic equipment associated with the wafer probe device. The laser trimming algorithm then trims feedback resistor 6. A computer program determines which of the laser cuts 46 need to be made in gross trim section 42 (FIG. 2) to cause $V_{OUT}$ to approach five volts (assuming that $V_A$ is a logical "zero" and the remaining digital inputs are logical "ones") After the appropriate laser cuts 46 have been made in "gross trim" section 42 of feedback resistor 6, the trimming program causes the laser beam of produce a cut 47 sufficiently far into "fine trim" section 39 to cause $V_{OUT}$ to be precisely 5.0 volts. This, of course, causes $R_F$ to have the desired precise value of 5 kilohms, since $I_{BIT}$ is equal to 1.0 milliamperes. This basic portion of the trimming operation then is complete.

An important advantage of the above-described procedure is that regardless of how large the initial deviation of the nichrome sheet resistance is from the nominal design value, very little laser trimming is required to cause the bit current determining resistors to produce precisely equal or binarily ratioed bit currents. For reasons subsequently explained with reference to FIG. 5, the sixteen bit current determining resistors can be designed to occupy a small amount of surface area of the silicon chip. Furthermore, the amount of laser time required for the laser trimming of such bit current determining resistors is very small.

Another very important advantage is that the laser trimming of integrated potentiometer 29 causes only a negligible increase in the terminal-to-terminal resistance thereof, so the current $I_{POT}$ flowing through integrated potentiometer 29 remains essentially unchanged, regardless of the amount of trimming required. Therefore, the laser trimming of potentiometer 29 causes little change in the current density in the emitter base junction of NPN transistor 32 or in the PN junctions of temperature-compensating diodes 30 and 31. Consequently, the above laser trimming of integrated potentiometer 29 produces no significant change in the thermal drift of the forward voltage drops across diodes 30 and 31 and the base-to-emitter voltage of transistor 32. Consequently, the temperature-compensating properties of bias voltage circuit 24 are not upset by the laser trimming operation on potentiometer 29, as would be the case if any other integrated circuit resistive voltage division technique (of which we are aware) are used.

Another possible advantage to the above described invention is that in the bit current determining resistors, possible long term variations in the resistance due to long laser cuts therein are avoided. Although the present assignee has not confirmed that long laser cuts and long, non-uniform edges thereof cause long term instability of laser trimmed resistors, others in the industry have reported that such instability does result from long, non-uniform laser cuts, possibly due to absorption of moisture or other impurities from or through the overlying oxide passivation that is provided over nichrome resistors, and also possibly due to migration of film materials, especially at high currents over prolonged periods of time.

After integrated potentiometer 29 is properly trimmed, the voltage on conductor 12 is established so that $I_{BIT}$ is exactly equal to one milliampere, within about ±1%. This means that the subsequent laser trimming of feedback resistor 6 can also be performed to produce an accuracy of ±1%. Thus, customers can rely upon the preciseness of the resistance of feedback resistor 6 to select external resistive components to connect in parallel and/or in series with feedback resistor 6 in order to adjust the range of $V_{OUT}$, without having to worry about deviations in the value of $R_F$. Yet the cost of manufacture of the DAC 1, with the foregoing advantages is much lower than than for all prior DACs having equivalent circuit performance.

Those skilled in the art will readily recognize that the manner in which voltage bias circuit 24 produces termperature compensation that results in a constant value of $V_{OUT}$ as the temperature varies from, say, $-55°$ Centigrade to $+125°$ Centigrade, is that the voltage drop across diode 26 matches, and therefore provides temperature compensation for, the base-emitter voltage of each of the bit current source transistors 11, 18, etc. Diodes 30 and 31 have the same variation with respect to temperature in their forward voltages drops as the base-emitter voltage of NPN transistor 25 and diode 26, respectively. Diodes 37 and 38 have the same variation in their forward voltage drops with respect to temperature as diodes 30 and 31. The variation with respect to temperature in forward voltage drop of diode 35 matches that of the base-emitter junction of NPN transistor 32.

As a practical matter, a somewhat more complex circuit than the one shown in FIG. 1 is utilized to implement the concepts of the present invention. Since zener diode 36 has a positive temperature coefficient, slightly more temperature compensation is needed than is provided by diode 35, so a well-known $V_{BE}$ multiplier circuit is used, as shown in FIG. 4.

Figure 4:
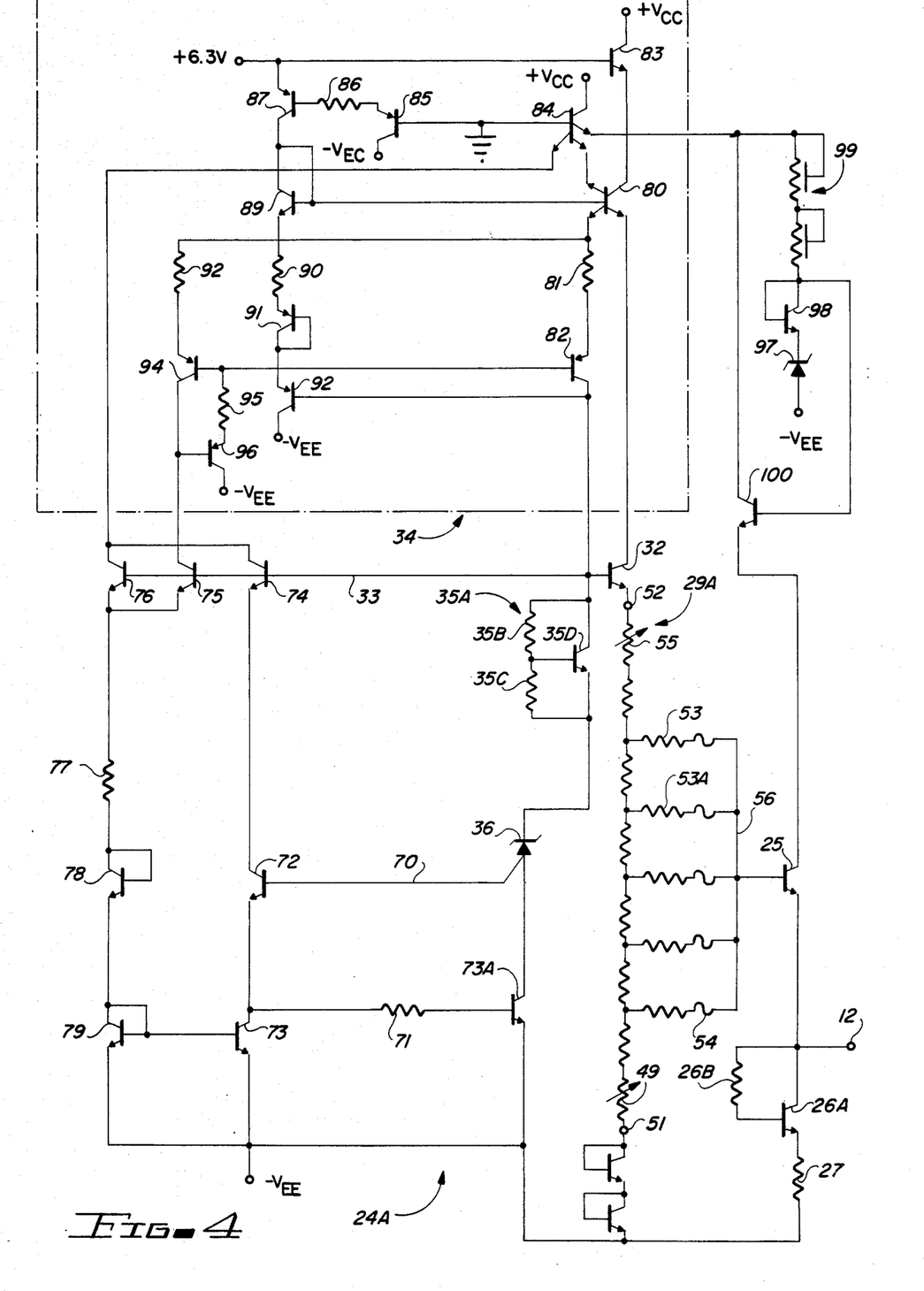
FIG. 4 is a schematic diagram of an alternate embodiment of invention.

Referring now to FIG. 4, a more refined implementation of the reference voltage producing circuit 24 of FIG. 1 is shown, and is designated by reference numeral 24A. Where appropriate, identical or similar reference numerals have been used in FIG. 4 to designate elements that correspond to those in FIGS. 1 and 3. In FIG. 4, potentiometer 29 of FIG. 1 is shown schematically as a lumped resistor equivalent model. Reference numeral 54 in FIG. 4 designates the laser cuts 54 of FIG. 3, reference numeral 53 in FIG. 4 generally designates the fingers or links 53 in FIG. 3, and reference numeral 53A in FIG. 4 designates one of the fingers or links in FIG. 3 that still is not laser cut after the gross trimming operation is complete.

In FIG. 4, reference numeral 34 designates a PNP current mirror circuit and associated "boot strap" reference circuitry that produces a constant voltage difference between the voltages on the collector and base of diode-connected transistor 89 and on conductor 33. Conductor 70 designates a typical Kelvin connection to zener diode 36 to eliminate the error-producing effects of lead resistance associated with zener diode 36. (This is a known technique, described in commonly assigned U.S. Pat. No. 4,381,497, FIG. 4, incorporated herein by reference.) Resistor 71 is connected between the collector of transistor 73 and the base of transistor 73A, and provides temperature compensation for the increase in beta (current gain, i.e., $I_C \div I_B$) with respect to temperature. As the temperature increases, beta increases, and the base current of transistor 73 decreases, reducing the voltage drop across resistor 71. The voltage drop across resistor 71 adds into the reference voltage produced on conductor 33, which then is translated to the reference voltage on conductor 12, which then is applied to the bases of the current source transistors 11, 18, etc.; variations with respect to temperature of transistor beta of the bit current source transistors 11, 18, etc., and the variations with respect to temperature of the beta of the current switch transistors such as 9, are thereby compensated for.

A "second order" compensation for changes in transistor beta with respect to temperature is accomplished by provision of resistor 26B between the base and collector of diode connected transistor 26A. This technique is also described in FIG. 4 of above mentioned commonly assigned U.S. Pat. No. 4,381,497. A well-known beta multiplier circuit 35A, including laser trimmable resistors 35B and 35C. is shown in series with zener diode 36, rather than diode 35 of FIG. 1. Again, this is a well-known technique, also described in FIG. 4 of commonly assigned U.S. Pat. No. 4,381,497.

The circuit including zener diode 97, diode 98, and pinched resistors 99 and transistor 100 effectively "bootstraps" the collector voltage of transistor 25 to a voltage determined primarily by zener diode 97. Pinched resistors 99 provide the necessary bias current for zener diode 97. This bootstrapping action tends to isolate the circuitry associated with current mirror and associated circuitry 34 from the above-mentioned parasitic signals, which are short pulses capacitively coupled onto conductor 12 every time one of the bit switches such as 16, 17, or 21 in FIG. 1 switches a bit current from ground into resistive ladder circuit 7 (FIG. 1) or vice versa.

Table 1 indicates exemplary values for the resistors shown in FIGS. 1 and 4.

TABLE 1

| Resistor | Kilohms |
|---|---|
| 6 | 5.0 |
| 13 | 3.7 |
| 19 | 7.4 |
| 26B | 30 |
| 27 | 3.7 |
| 29 | 7.2 |
| 35B | 4.9 |
| 35C | 3.7 |
| 53 | 1.2 |
| 71 | 17.3 |
| 77 | 7.4 |
| 81 | .5 |
| 86 | 16.9 |
| 90 | 4.4 |
| 95 | .5 |

When the circuit of FIG. 4 is utilized, the above-described technique for trimming the various resistors of DAC 1 can be advantageously modified, as subsequently explained. When the circuit of FIG. 4 is used, a suggested technique for trimming the DAC is to first turn on bit switch 16 so that $I_{BIT}$ in current source transistor 11 flows through conductor 14, ladder 7, and current summing conductor 5. Then that current is measured by connecting high precision five kilohm resistor 59 as indicated in dotted lines in FIG. 1. The laser trimming machine is used to perform the gross trim portion of the trimming operation on integrated potentiometer 29, by severing all of the fingers except one in order to adjust the current in current summing conductor 5 close to approach its desired value. The value of $V_{OUT}$ is measured to determine which link 53A should be left unsevered.

The foregoing operations are performed at an elevated temperature of about 105° C. with the wafer on a "hot chuck". Then, the wafer chuck temperature is lowered to room temperature. Empirical data or suitable equations can be used to determine how much the laser should trim $V_{BE}$ multiplier resistors 35B and 35C to compensate for the positive temperature coefficient of zener diode 36. Next, using the previously described technique for determining the current in current summing conductor 5, a fine trim operation on potentiometer 29 is performed to cause $V_{OUT}$ to equal exactly 5.0 volts.

There are numerous different ways in which the feedback resistor 6 can be trimmed to its precise value. For example, before the integrated potentiometer is trimmed, feedback resistor 6 can be trimmed to a precise five kilohm value independently of the rest of the circuit shown in FIG. 1. In this event, feedback resistor 6 can be used instead of the above-mentioned external precision resistor used to determine the amount of current flowing in the current summing conductor 5. Alternately, after the bit current $I_{BIT}$ is established by the above-described precise trimming of integrated potentiometer 29, feedback resistor 6 can be laser trimmed to a precise value on the basis of measurement of $V_{OUT}$.

The bit current determining resistors 13, 19, and 23 need to be trimmed so that the bit currents $I_{BIT}$ are all precisely equal. This is referred to as a "linearizing" trim. This linearizing trim operation can be performed at any convenient time during the trimming operation. More specifically, the linearizing trim operation can be performed after the trimming of potentiometer 29 and/or feedback resistor 6 to perform a final slight adjustment in each bit current $I_{BIT}$.

Thus, it can be seen that the circuit described in FIGS. 1-4 enables one skilled in the art to provide a monolithic sixteen bit DAC that is low in cost because (1) the sixteen bit current determining resistors can be designed to occupy minimum amount chip area, and (2) the circuit requires relatively little laser trimming time despite the fact that the sheet resistance of the nichrome of which the bit current determining resistors, the feedback resistor, and the integrated potentiometer can vary by about ±30% from wafer to wafer, and despite the fact that the feedback resistor is trimmed to an accuracy of 1%.

These important advantages have been made possible, without upsetting the sensitive temperature stability of the bit currents $I_{BIT}$, by the provision of finely adjustable integrated potentiometer 29. The integrated potentiometer maintains essentially constant current density in the temperature-compensating elements through which the current $I_{POT}$ flows constant, irrespective of the amount of trimming of potentiometer 29 that is required to compensate for deviation of the nichrome sheet resistance of the present wafer from its "nominal" value. Note, however, that it is desirable for the bit currents such as $I_{BIT}$ to have a thermal drift that is equal in magnitude to and opposite in sign to that of the feedback resistor $R_F$, so that $V_{OUT}$ has no thermal drift. It is expected that the potentiometer 29 will have similar useful applications in other circuits wherein precise adjustability of reference voltages must be achieved without upsetting the performance of sensitive, temperature-compensating circuitry.

An example will now be given to illustrate how important it is to avoid circuit designs that require laser trimming of a large number of resistors over a range that is a large percentage of their minimum values. FIG. 5 shows a nichrome bit current determining resistor 64, drawn to scale, that does not need to be trimmed to an absolute value, and therefore does not require a large proportionate change in its terminal-to-terminal resistance to be produced by laser trimming. Most of the resistance of nichrome resistor 64 is provided by the narrow elongated segments 65. The fine trim section 67 produces a relatively small change in the terminal-to-terminal resistance, even if the laser cut 68 extends entirely through fine trim section 67.

By way of comparison, consider a nichrome bit current determining resistor 64A, also drawn to scale in FIG. 5 which must be trimmed to a precise absolute value. It may require a much larger proportionate increase in its terminal-to-terminal resistance to be produced by laser trimming cut 68A. Fine trim section 67A of resistor 64A must be much larger than fine trim section 67 of resistor 64. Obviously, bit current determining resistor 64A requires much more (nearly twice as much) chip area than a resistor such as 64. It would be undesirable to have to use physically large resistors such as 64A to implement a sixteen bit current determining resistors 13, 19, etc., in FIG. 1.

Next, a numerical example will be given to demonstrate why large area bit current determining resistors such as 64A of FIG. 5 would be required if the circuit including integrated potentiometer 29 were not provided. Assume that each of the resistors 13, 19, etc. needs to have a ten kilohm resistance. Note that all laser trimming procedures increase resistance; no "trim down" procedures are available. Therefore, the sixteen bit current determining resistors have to be laid out on the surface of the chip so as to allow for the possibility that the nichrome sheet resistance will be 30% greater than its nominal value. Consequently, the size of the bit current determining resistors have to be selected as if the desired resistance is ten kilohms divided by 1.3, i.e., as if the nominal resistance is 7.7 kilohms. Then, assume that in instead of the resistivity of the nichrome being 30% greater than its nominal value, it is 30% less. In this event, the actual values of the untrimmed bit current determining resistors will be 0.7 times 7.7, i.e., 5.3 kilohms, only approximately half of their desired value of ten kilohms. It will be necessary to laser trim them up to ten kilohms, i.e., to a value approximately 89% higher than their untrimmed value.

Thus, it can be seen that if a bit current determining resistor must be trimmed to a precise absolute value, then the structure of the bit current determining resistors will have to be quite similar to the structure of resistor 64A shown in FIG. 5, wherein the amount of chip area consumed is about twice the amount that would be required if only a minor amount of trimming is required.

While the invention has been described with reference to several particular embodiments thereof, those skilled in the art will be able to make various modifications to the described embodiments without departing from the true spirit and scope of the invention. For example, it is intended that all circuits and devices which are equivalent to those described herein in that its corresponding elements or operating steps produce substantially the same function in substantially the same manner to accomplish substantially the same result are to be considered within the scope of the invention. For example. other reference voltage producing circuits than circuit 24 of FIG. 1 and 24A of FIG. 4, even circuits without using integrated potentiometers, can be used, as long as they maintain essentially constant current density in the PN junctions of the temperature-compensating elements through the range of adjustment of a resistor that controls the bias voltage applied to conductor 12. Such circuits could be implemented by using low drift operational amplifiers instead of an integrated potentiometer, although the amount of chip area used therefore would be consistently increased.

As those skilled in the art will recognize, some applications of the digital-to-analog converter of the present invention will require the accurate resistor $R_F$, but not the output amplifier 4. For example, if the digital-to-analog converter is used as a component of a successive approximation analog-to-digital converter, comparator circuitry will be used instead of the output amplifiers. An analog signal is applied to one input of the comparator, and various digital inputs are applied to the DAC inputs until a digital input word is found that produces a null condition at the comparator input, indicating that the digital representation of the analog signal has been found.

We claim:

1. A method of manufacturing a digital-to-analog converter that includes an output amplifier having an input coupled to a current summing conductor that is also coupled to a plurality of bit current switches for selective steering of bit currents in the collectors of a plurality of bit current source transistors, and temperature-compensating reference voltage means for producing a first reference voltage on the bases of the bit current source transistors to produce a predetermined variation of the bit currents with respect to temperature, the method comprising the steps of:
   (a) providing
      1. a plurality of bit current determining resistors each coupled to an emitter of a respective one of the bit current source transistors and to a first supply voltage conductor,
      2. a means electrically coupled to the current summing conductor for determining the amount of current in the current summing conductor, and
      3. a trimmable integrated potentiometer in the temperature-compensating reference voltage means, the temperature-compensating reference voltage means generating a second reference voltage between the first supply voltage conductor and one terminal of the integrated potentiometer, the integrated potentiometer having a gross trim section including a plurality of spaced links connected between a body portion of the integrated potentiometer and a tap conductor, and first and second fine trim sections disposed on opposite sides of the gross trim section;
   (b) coupling the voltage on the tap conductor to the bases of the bit current source transistors,
   (c) applying suitable predetermined voltages to the digital-to-analog converter to cause a first bit current to flow in a predetermined one of the bit current source transistors;
   (d) operating a trimming device to sever all of the links of the gross trim section except one to cause the current in the summing conductor to approach a predetermined level; and
   (d) operating the trimming device to trim one of the first and second fine trim sections to cause the current in the summing conductor to precisely equal the predetermined level,
   wherein the current in the integrated potentiometer and flowing through PN junctions of temperature sensitive portions of the temperature-compensating voltage reference means remains essentially constant during the trimming, and thereby avoids upsetting the temperature-compensating properties of the temperature-compensating reference voltage means.

2. The method of claim 1 including trimming various ones of the bit current determining resistors to linearize the bit currents, and hence the output voltage produced by the output amplifier.

3. The method of claim 1 including providing a feedback resistor with one terminal connected to the current summing conductor, and trimming the feedback resistor to a precise value by means of the trimming device, wherein if the sheet resistance of the material of which the feedback resistor and the bit current determining resistors is substantially different than its nominal value, the amount of trimming of the bit current determining resistors is a much smaller percentage of their initial resistances than is the case for the trimming of the feedback resistor.

4. The method of claim 1 wherein step (c) includes using a laser beam.

5. The method of claim 4 wherein the bit current determining resistors, the integrated potentiometer, and the feedback resistor are all composed of nichrome.

6. The method of claim 5 wherein the means for determining the amount of current in the current summing conductor includes a precise external resistor connected between the input and the output of the output amplifier and means for measuring the voltage with respect to ground of the output of the output amplifier, are input of the output amplifier being referenced to ground.

7. The method of claim 5 wherein step (b), and the providing of the electrical coupling of the means for determining the amount of current in the current summing conductor, are performed using a wafer probing mechanism.

8. The method of claim 5 including providing a $V_{BE}$ multiplier circuit in series connection with a zener diode in the temperature-compensating reference voltage means and wherein the method includes controlling the laser beam to first perform a gross trimming operation on the integrated potentiometer by measuring the current in the current summing junction by means of a precise, external resistor coupled between the input and output of the output amplifier and measuring the output voltage of the output amplifier at a raised temperature, lowering the temperature to a predetermined temperature, measuring the output voltage, determining the amount to trim the resistors of the $V_{BE}$ multiplier on the basis of those measurements of the output voltage, trimming the resistors of the $V_{BE}$ multiplier to optimize the variation of the current in the current summing conductor, and using the laser to provide a fine trim of one of the first and second fine trim sections of the integrated potentiometer to cause the current in the current summing junction to have a minimum dependence upon temperature.

9. The method of claim 1 wherein the method is for manufacturing a monolithic digital-to-analog converter.

10. The method of claim 1 including providing the current determining resistors, the feedback resistor, and the potentiometer with sheet resistances which are within approximately ±30% of a nominal value, wherein the feedback resistor is trimmed to within approximately ±1% of a predetermined absolute value, and wherein the bit current determining resistors are trimmed less than about 2% of their initial value to linearize the bit currents.

11. In a monolithic analog-to-digital converter including
 1. an output amplifier having an input coupled to a current summing conductor,
 2. a feedback resistor coupled to the current summing conductor,
 3. a plurality of bit current switches for steering of bit currents in the collectors of a plurality of bit current source transistors,
 4. a plurality of bit current determining resistors each coupled between an emitter of a respective one of the bit current source transistors and a first supply voltage conductor, and
 5. temperature-compensating reference voltage means for producing a first reference voltage on the bases of the bit current source transistors to maintain the bit currents essentially constant with respect to temperature, the improvement comprising in combination:
(a) an integrated potentiometer in the temperature-compensating reference voltage means having a gross trim section including a plurality of spaced links connected between a body portion of the integrated potentiometer and a tap conductor, and first and second fine trim sections disposed on opposite sides of the gross trim section, and means for causing current that flows through the integrated potentiometer to also flow through certain temperature sensitive elements of the temperature-compensating reference voltage means but not through certain other temperature sensitive elements thereof, the certain temperature sensitive elements having the property that any substantial change in the current flowing through the integrated potentiometer would substantially upset the temperature-compensating properties of the temperature-compensating reference voltage means and would thereby cause the bit currents to vary unacceptably with respect to temperature, wherein the temperature-compensating reference voltage circuit means generates a second reference voltage between the first supply voltage conductor and a terminal of the integrated potentiometer;
(b) resistive material of which the bit current determining resistors, the feedback resistor, and the integrated potentiometer are composed, having a sheet resistance within roughly ±30% of a predetermined sheet resistance;
(c) laser triming cuts in some of the bit current determining resistors, which laser trimming cuts cause at least a plurality of the bit currents to have essentially equal or binarily weighted values;
(d) a laser trimming cut in the feedback resistor, which laser trimming cut causes the value of the feedback resistor to change by as much as about 90% to cause the resistance of the feedback resistor to have a value within about ±1% of a first predetermined resistance value; and
(e) laser cuts in a plurality of the links in the gross trim section of the integrated potentiometer and in one of the first and second fine trim sections, wherein the total change in resistance of the integrated potentiometer caused by the laser cuts therein is so small that it causes no substantial change in the thermal drift of temperature-compensating elements through which the current in the integrated potentiometer also flows.

12. In a monolithic digital-to-analog converter, the improvement of claim 11 wherein the temperature-compensating reference voltage circuit means includes a zener diode and the certain temperature-compensating elements include a plurality of temperature-compensating PN junction circuit elements connected in series with the zener diode to generate a reference voltage with a predetermined thermal drift between the first supply voltage conductor and the base of a first emitter follower transistor having its emitter connected to one terminal of the integrated potentiometer, the certain other temperature-compensating elements include the first emitter follower transistor and a plurality of temperature-compensating PN junction circuit elements connected in series with the integrated potentiometer.

13. In a monolithic digital-to-analog converter, the improvement of claim 12 wherein one of the PN junction temperature-compensating elements includes a $V_{BE}$ multiplier circuit and another of the PN junction temperature-compensating elements includes a first transistor having its base coupled by means of a first resistor to the emitter of a second transistor having its base coupled to the anode of the zener diode to provide a Kelvin connection thereto.

14. In a monolithic digital-to-analog converter, the improvement of claim 13 including an R/2R resistive ladder network coupled between the plurality of bit current switches and the current summing conductor.

15. In a monolithic digital-to-analog converter, the improvement of claim 14 wherein the bit current source transistors, the bit switch transistors, the $V_{BE}$ multiplier transistor, and the first and second transistors, are all NPN transistors.

16. A method of manufacturing a digital-to-analog converter that includes an output circuit having an input coupled to a current summing conductor that is also coupled to a plurality of bit current switches for selective steering of bit currents in the collectors of a plurality of bit current source transistors, and temperature-compensating reference voltage means for producing a first reference voltage on the bases of the bit current source transistors to produce a predetermined variation of the bit currents with respect to temperature, the method comprising the steps of:
(a) providing
1. a plurality of bit current determining resistors each coupled to an emitter of a respective one of the bit current source transistors and to a first supply voltage conductor,
2. a means electrically coupled to the current summing conductor for determining the amount of current in the current summing conductor,
3. trimmable circuit means, disposed in the temperature-compensating reference voltage means, for producing the first reference voltage, the trimmable circuit means including a first trimmable resistive means for adjusting the first reference voltage without substantially changing the current density in PN junctions of temperature sensitive portions of the temperature-compensating voltage reference means during trimming of the first trimmable resistive means, and thereby avoiding upsetting of temperature-compensating properties of the temperature-compensating reference voltage means, wherein the temperature compensating reference voltage means generates a second reference voltage between the first supply voltage conductor and one terminal of the trimmable circuit means;
(b) applying suitable predetermined voltages to the digital-to-analog converter to cause a first bit current to flow in a predetermined one of the bit current source transistors;
(c) operating a trimming device to trim the first trimmable resistive means to cause the current in the summing conductor to equal a predetermined value.

17. The method of claim 16 wherein the first trimmable resistive means includes a trimmable integrated potentiometer having a gross trim section including a plurality of severable spaced links connected between a body portion of the integrated potentiometer and a tap conductor, and first and second fine trim sections disposed on opposite sides of the gross trim section.

18. The method of claim 17 wherein the output circuit includes a comparator, and wherein the digital-to-analog converter is included in an analog-to-digital converter, and the current summing conductor is coupled to one input of the comparator and an analog signal is applied to the other input of the comparator.

19. In a monolithic digital-to-analog converter including
1. an output circuit having an input coupled to a current summing conductor,
2. a first resistor coupled to the current summing conductor,
3. a plurality of bit current switches for steering of bit currents in the collectors of a plurality of bit current source transistors,
4. a plurality of bit current determining resistors each coupled between an emitter of a respective one of the bit current source transistors and a first supply voltage conductor, and
5. temperature-compensating reference voltage means for producing a first reference voltage on the bases of the bit current source transistors to maintain the bit currents essentially constant with respect to temperature,
the improvement comprising in combination:
(a) an integrated potentiometer having a gross trim section including a plurality of spaced links connected between a body portion of the integrated potentiometer and a tap conductor, and first fine trim sections disposed on one side of the gross trim section, and means for causing current that flows through the integrated potentiometer to also flow through certain temperature sensitive elements of the temperature-compensating reference voltage means but not through certain other temperature sensitive elements thereof, the certain temperature sensitive elements having the property that any substantial change in the current flowing through the integrated potentiometer would substantially upset the temperature-compensating properties of the temperature-compensating reference voltage means and would thereby cause the bit currents to vary unacceptably with respect to temperature, wherein the temperature-compensating reference voltage means generates a second reference voltage between the first supply conductor and one terminal of the integrated potentiometer;
(b) resistive material of which the bit current determining resistors, the first resistor, and the integrated potentiometer are composed, having a sheet resistance within roughly ±30% of a predetermined sheet resistance;
(c) laser trimming cuts in some of the bit current determining resistors, which laser trimming cuts cause at least a plurality of the bit currents to have essentially equal or binarily weighted values;
(d) a laser trimming cut in the resistor, which laser trimming cut causes the value of the first resistor to change by as much as about 90% to cause the resistance of the first resistor to have a value within about ±1% of a first predetermined resistance value; and
(e) laser cuts in a plurality of the links in the gross trim section of the integrated potentiometer and in one of the first and second fine trim sections, wherein the total change in resistance of the integrated potentiometer caused by the laser cuts therein is so small that it causes no substantial change in the thermal drift of temperature-compensating elements through which the current in the integrated potentiometer also flow.

20. In a monolithic analog-to-digital converter including

1. temperature-compensating reference voltage means for producing a first reference voltage on the base of a plurality of bit current source transistors to maintain the bit currents essentially constant with respect to temperature, the improvement comprising in combination:

(a) an integrated potentiometer in the temperature-compensating reference voltage means having a gross trim section including a plurality of spaced links connected between a body portion of the integrated potentiometer and a tap conductor, and first and second fine trim sections disposed on opposite sides of the gross trim section;

(b) means for causing current to flow through the integrated potentiometer and to also flow through certain temperature sensitive elements of the temperature-compensating reference voltage means but not through certain other temperature sensitive elements thereof, wherein the temperature-compensating reference voltage means generates a second reference voltage between the first supply voltage conductor and a terminal of the integrated potentiometer;

(c) resistive material of which the bit current determining resistors and the integrated potentiometer are composed; and (d) laser trimming cuts in some of the bit current determining resistors, which laser trimming cuts cause at least a plurality of the bit currents to have essentially equal or binarily weighted values.

* * * * *